US012699319B2

(12) United States Patent
Koh et al.

(10) Patent No.: US 12,699,319 B2

(45) Date of Patent: Aug. 4, 2026

(54) SEMICONDUCTOR PHOTORESIST COMPOSITION AND METHOD OF FORMING PATTERNS USING THE COMPOSITION

(71) Applicants: Samsung Electronics Co., Ltd., Suwon-si (KR); DCT MATERIAL LLC., Suwon (KR)

(72) Inventors: Chawon Koh, Suwon-si (KR); Yeon Hee Seong, Suwon-si (KR); Tsunehiro Nishi, Suwon-si (KR); Geun Su Lee, Suwon-si (KR); Sung Jae Jung, Suwon-si (KR); Moo Hyun Koh, Suwon-si (KR); Ji Young Park, Suwon-si (KR); Seungyeol Baek, Suwon-si (KR)

(73) Assignees: Samsung Electronics Co., Ltd., Gyeonggi-do (KR); DCT MATERIAL LLC., Chungcheongbuk-do (KR)

( * ) Notice: Subject to any disclaimer, the term of this patent is extended or adjusted under 35 U.S.C. 154(b) by 388 days.

(21) Appl. No.: 18/449,156

(22) Filed: Aug. 14, 2023

(65) Prior Publication Data

US 2024/0255848 A1 Aug. 1, 2024

(30) Foreign Application Priority Data

Dec. 23, 2022 (KR) ........................ 10-2022-0183373

(51) Int. Cl.

*G03F 7/004* (2006.01)
*C07F 7/22* (2006.01)

(Continued)

(52) U.S. Cl.

CPC .......... *G03F 7/0045* (2013.01); *C07F 7/2224* (2013.01); *C07F 9/6596* (2013.01);

(Continued)

(58) Field of Classification Search

CPC .......... G03F 7/168; G03F 7/0757; G03F 7/38; G03F 7/0042; G03F 7/0045;

(Continued)

(56) References Cited

U.S. PATENT DOCUMENTS

| | | | |
|---|---|---|---|
| 5,061,599 | A | 10/1991 | Kudo et al. |
| 8,366,967 | B2 | 2/2013 | Keszler et al. |
| 8,415,000 | B2 | 4/2013 | Stowers et al. |
| 9,176,377 | B2 | 11/2015 | Stowers et al. |

(Continued)

FOREIGN PATENT DOCUMENTS

| | | | |
|---|---|---|---|
| CN | 114063389 | A | 2/2022 |
| KR | 20220095940 | A | 7/2022 |
| WO | WO-2019/093145 | A1 | 5/2019 |

OTHER PUBLICATIONS

Okamoto et al., "Peroxypolytungstic acids: A new inorganic resist material," Applied Physics Letters, 49, 5, 298-300, 1986.

*Primary Examiner* — Mouloucoulaye Inoussa

(74) *Attorney, Agent, or Firm* — HARNESS, DICKEY & PIERCE, P.L.C.

(57) ABSTRACT

The present disclosure relates to a semiconductor photoresist composition including an organometallic compound represented by Chemical Formula 1 and a solvent, and a method of forming patterns by using the semiconductor photoresist composition.

20 Claims, 7 Drawing Sheets

(51) Int. Cl.

| | |
|---|---|
| ***C07F 9/6596*** | (2006.01) |
| ***G03F 7/075*** | (2006.01) |
| ***G03F 7/16*** | (2006.01) |
| ***G03F 7/38*** | (2006.01) |
| ***H10P 76/20*** | (2026.01) |

(52) U.S. Cl.
CPC ............ *G03F 7/0757* (2013.01); *G03F 7/168* (2013.01); *G03F 7/38* (2013.01); *H10P 76/2041* (2026.01)

(58) Field of Classification Search
CPC .... G03F 7/0043; G03F 7/0044; G03F 7/2004; G03F 7/0046; G03F 7/11; G03F 7/325; G03F 7/0048; G03F 7/40; G03F 7/70033; G03F 7/0041; C07F 7/2224; C07F 9/6596; C07F 7/2296; H01L 21/0274; H01L 21/31144
See application file for complete search history.

(56) References Cited

U.S. PATENT DOCUMENTS

| | | | | |
|---|---|---|---|---|
| 9,281,207 | B2 | 3/2016 | Stowers et al. | |
| 9,310,684 | B2 | 4/2016 | Meyers et al. | |
| 9,823,564 | B2 | 11/2017 | Stowers et al. | |
| 10,025,179 | B2 | 7/2018 | Meyers et al. | |
| 2007/0009832 | A1* | 1/2007 | Kinsho | C07D 319/06 430/270.1 |
| 2007/0218402 | A1* | 9/2007 | Kinsho | C07F 7/1804 430/270.1 |
| 2011/0294069 | A1* | 12/2011 | Bae | G03F 7/16 430/311 |
| 2018/0224741 | A1* | 8/2018 | Chuang | G03F 7/327 |
| 2019/0094691 | A1 | 3/2019 | Kasahara | |
| 2019/0129305 | A1* | 5/2019 | Lee | G03F 7/0392 |
| 2021/0109442 | A1* | 4/2021 | Moon | H01L 21/0274 |
| 2021/0347791 | A1 | 11/2021 | Cardineau et al. | |
| 2024/0027899 | A1* | 1/2024 | Han | G03F 7/11 |
| 2024/0219829 | A1* | 7/2024 | Baskaran | G03F 7/168 |
| 2024/0353752 | A1* | 10/2024 | Lu | C07F 7/2224 |
| 2024/0377748 | A1* | 11/2024 | Shimizu | H01L 21/0274 |

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit, under 35 U.S.C. § 119, of Korean Patent Application No. 10-2022-0183373 filed in the Korean Intellectual Property Office on Dec. 23, 2022, the entire contents of which are incorporated herein by reference.

BACKGROUND

(a) Field

This disclosure relates to semiconductor photoresist compositions, methods of forming patterns using semiconductor photoresist compositions, semiconductor photoresist compositions including organometallic compounds having a 6-membered ring structure, and methods of forming patterns using semiconductor photoresist compositions including organometallic compounds having a 6-membered ring structure.

(b) Description of the Related Art

EUV (extreme ultraviolet) lithography is viewed as a technology for manufacturing next generation semiconductor devices. EUV lithography is a pattern-forming technology using an EUV ray having a wavelength of about 13.5 nm as an exposure light source. Using EUV lithography, a fine pattern (e.g., less than or equal to about 20 nm) may be formed in an exposure process during the manufacture of a semiconductor device.

EUV lithography may be realized through the development of compatible photoresists which may perform at a spatial resolution of less than or equal to about 16 nm. Efforts to satisfy the specifications of next generation devices by traditional chemically amplified (CA) photoresists may be insufficient with regard to resolution, photospeed, and/or feature roughness (or referred to as line edge roughness (LER)).

An intrinsic image blur, due to an acid catalyzed reaction in these polymer-type photoresists, limits resolution in small feature sizes. The CA photoresists are designed for high sensitivity, but their typical elemental makeups reduce light absorbance of the photoresists at a wavelength of about 13.5 nm the CA photoresists may have more difficulties under EUV exposure due to CA photoresists' decreased sensitivity.

In addition, the CA photoresists may have difficulties in the small feature sizes due to roughness issues. The line edge roughness (LER) of the CA photoresists is increased as a photospeed is decreased partially due to acid catalyst processes. Accordingly, a higher-performance photoresist may be advantageous in the semiconductor industry because of these defects and problems in CA photoresists.

In order to overcome the aforementioned drawbacks of CA organic photosensitive compositions, inorganic photosensitive compositions have been researched. Inorganic photosensitive compositions may be used for negative tone patterning. Inorganic photosensitive composition may have a resistance against removal by a developer composition due to chemical modification through a nonchemical amplification mechanism. Inorganic photosensitive compositions may contain an inorganic element having a higher EUV absorption rate than hydrocarbon. Therefore, inorganic photosensitive compositions may secure sensitivity through nonchemical amplification mechanisms. Additionally, inorganic compositions may be less sensitive about stochastic effects and may have lower line edge roughness and smaller number of defects.

Active research has been conducted into molecules containing tin which has improved absorption of extreme ultraviolet rays. As for an organotin polymer among them, alkyl ligands are dissociated by light absorption or secondary electrons are produced thereby, and cross-linked with adjacent chains through oxo bonds. Thus the negative tone patterning may be enabled and may not be removed by an organic developing solution.

Such organotin polymers may not only maintain resolution and line edge roughness, but also exhibit improved sensitivity. However, such metal materials are easily oxidized by moisture, heat, etc., and thus may be vulnerable to these environmental sensitivities. Accordingly, these vulnerable characteristics of the organotin polymers may bring about wafer-to-wafer critical dimension (CD) fluctuations and thus deteriorate a yield thereof. Additionally, the organotin polymers may have insufficient storage-stability and thus may be difficult to mass produce. In order to make the organotin polymers commercially available, it may be advantageous to further improve the aforementioned patterning characteristics such as securing a stable material with low reactivity with moisture and the like.

SUMMARY

One aspect of the present disclosure provides semiconductor photoresist compositions that are capable of implementing higher-resolution patterns, have improved etching resistance, a smaller LER, improved sensitivity, are more stable against moisture, and have a good shelf life.

Another aspect of the present disclosure provides methods of forming patterns using semiconductor photoresist compositions.

Some example embodiments of semiconductor photoresist compositions may include an organometallic compound represented by Chemical Formula 1, and a solvent.

[Chemical Formula 1]

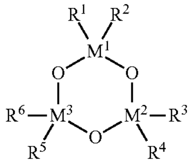

In Chemical Formula 1, $M^1$ to $M^3$ may each independently be one metal selected from Sn, Sb, Te, I, Ti, Bi, Po, At, In, Ag, Au, Pt, Si, Al, or Ga, $R^1$ to $R^6$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, a functional group containing at least one heteroatom selected from O, S, Si, N, Se, Te, P, Ge, Sn, Al, or In, or a combination thereof, and at least one of $R^1$ to $R^6$ may be a functional group containing at least one heteroatom selected from O, S, Si, N, Se, Te, P, Ge, Sn, Al, or In.

Some example embodiments of organometallic compounds may be represented by Chemical Formula 2.

[Chemical Formula 2]

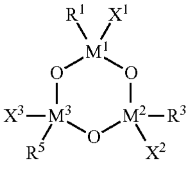

In Chemical Formula 2, $M^1$ to $M^3$ may each independently be one metal selected from Sn, Sb, Te, I, Ti, Bi, Po, At, In, Ag, Au, Pt, Si, Al, or Ga, $X^1$ to $X^3$ may each independently be a functional group containing at least one heteroatom selected from O, S, Si, N, Se, Te, P, Ge, Sn, Al, or In, and $R^1$, $R^3$, and $R^5$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, or a combination thereof.

$X^1$ to $X^3$ may each independently be a functional group containing at least one heteroatom selected from O, S, P, or Si.

$X^1$ to $X^3$ may each independently be O-L-$R^7$, OC(O)$R^8$, OSi($R^9$)($R^{10}$)($R^{11}$), OSi(O)$R^{12}$, OS$(O)_2R^{13}$, or OP(O)$R^{14}$, L may be a single bond or a substituted or unsubstituted C1 to C10 alkylene group, and $R^7$ to $R^{14}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

$R^7$ to $R^{14}$ may each independently be hydrogen, a methyl group, an ethyl group, an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, a sec-octyl group, a tert-butyl group, a tert-pentyl group, a tert-hexyl group, a tert-heptyl group, a tert-octyl group, a tert-nonyl group, a tert-decyl group, a phenyl group, or a biphenyl group.

An example embodiment of a solvent may be one selected from an aromatic compound, alcohols, ethers, esters, ketones, naphtha, or a mixture thereof.

An example embodiment of an organometallic compound may form a cluster in the solvent.

An example embodiment of a semiconductor photoresist composition may further include cyclic polysiloxane.

An example embodiment of cyclic polysiloxane may be represented by Chemical Formula 20.

[Chemical Formula 20]

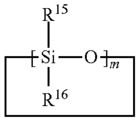

In Chemical Formula 20, $R^{15}$ and $R^{16}$ may each independently be a substituted or unsubstituted C1 to C20 alkyl group, a substituted or unsubstituted C2 to C20 alkenyl group, a substituted or unsubstituted C2 to C20 alkynyl group, or a combination thereof, and m is an integer of 2 to 10.

The cyclic polysiloxane may be included in an amount of about 10 parts by weight to about 90 parts by weight based on 100 parts by weight of the organometallic compound.

At least one of $M^1$ to $M^3$ may be Sn.

An example embodiment of an organometallic compound may be represented by any one of Chemical Formula 3 to Chemical Formula 8.

[Chemical Formula 3]

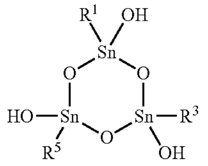

[Chemical Formula 4]

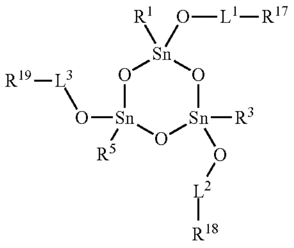

[Chemical Formula 5]

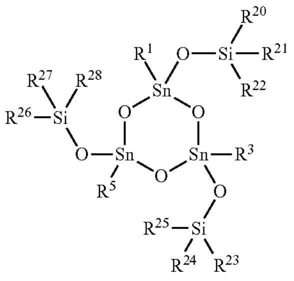

[Chemical Formula 6]

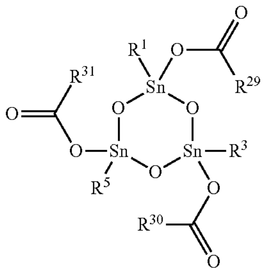

-continued

[Chemical Formula 7]

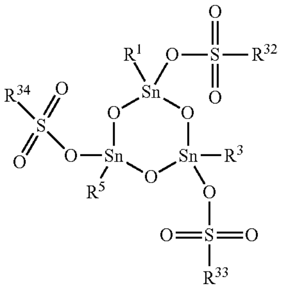

[Chemical Formula 8]

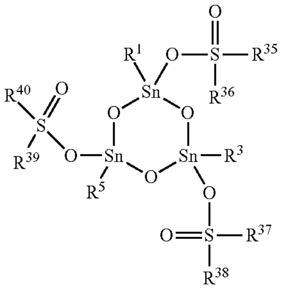

In Chemical Formula 3 to Chemical Formula 8, $R^1$, $R^3$, $R^5$, and $R^{17}$ to $R^{34}$ may each independently be a substituted or unsubstituted C1 to C10 alkyl group or a substituted or unsubstituted C6 to C12 aryl group, and $R^{35}$ to $R^{40}$ may each independently be hydrogen, a substituted or unsubstituted C1 to C10 alkyl group, or a substituted or unsubstituted C6 to C12 aryl group.

An example embodiment of an organometallic compound may be any one of those listed in Group 2.

[Group 2]

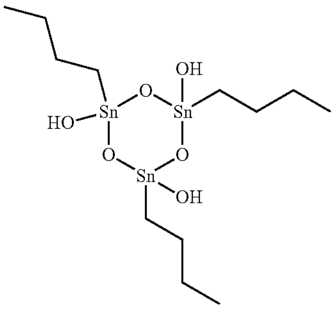

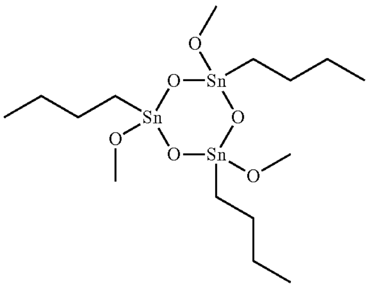

-continued

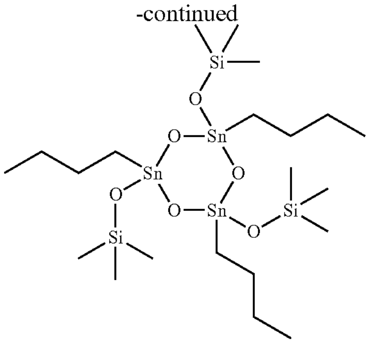

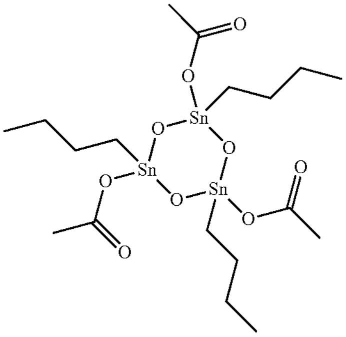

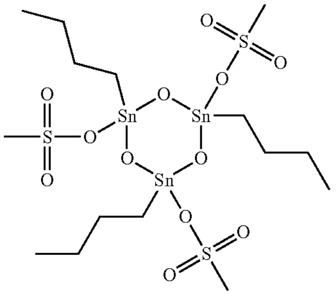

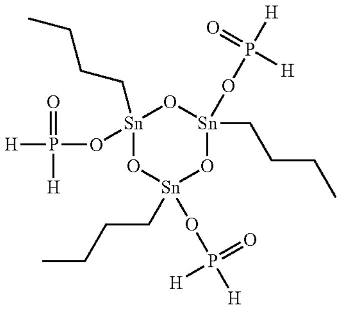

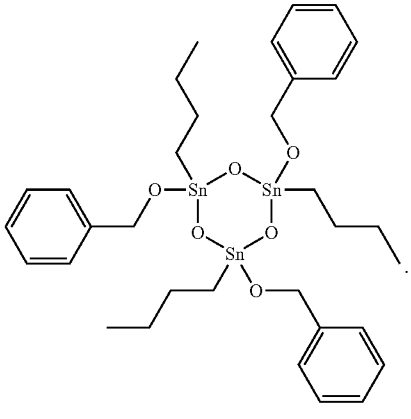

An example embodiment of an organometallic compound may be included in an amount of about 1 weight percent to about 30 weight percent based on 100 weight percent of the semiconductor photoresist composition.

An example embodiment of a method of forming patterns may include forming an etching subject layer on a substrate, coating the semiconductor photoresist composition on the etching subject layer to form a photoresist layer, patterning the photoresist layer to form a photoresist pattern, and etching the etching subject layer using the photoresist pattern as an etching mask.

A first baking process, an exposure process, a second baking process, and a developing process may be performed between the forming of the photoresist layer and the forming of the photoresist pattern, and the first baking process may be performed at a temperature of about 80° C. to about 180° C. for about 30 seconds to about 3 minutes.

The exposure process may use light having a wavelength of about 5 nm to about 150 nm.

The second baking process may be performed at a temperature of about 120° C. to about 200° C. for about 30 seconds to about 3 minutes.

The developing process may be performed by dissolving and removing the photoresist layer corresponding to the non-exposed region using a developer, and the developer may be an organic solvent that is a ketone such as methyl ethyl ketone, acetone, cyclohexanone, and 2-heptanone, an alcohol such as 4-methyl-2-propanol, 1-butanol, isopropanol, 1-propanol, and methanol, an ester such as propylene glycol monomethyl ether acetate, ethyl acetate, ethyl lactate, n-butyl acetate, or butyrolactone, an aromatic compound such as benzene, xylene and toluene, or a combination thereof; or may be an organic solvent in which an acidic substance or a basic substance that is mixed with the organic solvent in an amount of less than or equal to about 9 weight percent.

The photoresist pattern may have a width of about 5 nm to about 100 nm.

A semiconductor photoresist composition according to example embodiments may have improved resolution, and etching resistance. Therefore, a photoresist pattern according to according to example embodiments may not collapse even if the composition has improved limit resolution and a higher aspect ratio.

DETAILED DESCRIPTION

Figure 1:
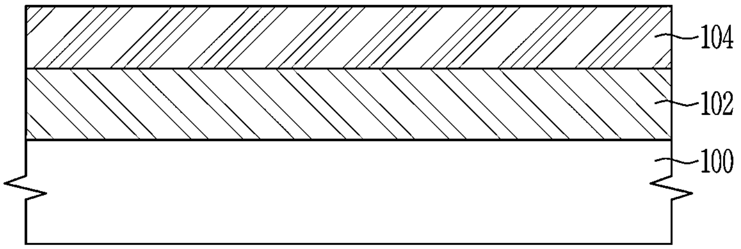
FIGS. 1 to 5 are cross-sectional views of a method of forming patterns using a semiconductor photoresist composition according to an example embodiment.

The present disclosure will be described more fully hereinafter with reference to the accompanying drawings, in which some example embodiments are shown. As those skilled in the art would realize, the described embodiments may be modified in various different ways, all without departing from the spirit or scope of the present disclosure.

In order to describe the present disclosure, parts which are not related to the description are omitted, and the same reference numeral refers to the same or like components, throughout the specification.

The size and thickness of each constituent element as shown in the drawings are depicted for better understanding and ease of description, and this disclosure is not necessarily limited to as shown. In the drawings, the thickness of layers, films, panels, regions, etc., are exaggerated for clarity. In the drawings, the thickness of a portion of layers or regions, etc., is exaggerated for clarity.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion is to be disposed above or below the reference portion and does not necessarily mean "above" toward an opposite direction of gravity.

In addition, unless explicitly described to the contrary, the word "comprise," and variations such as "comprises" or "comprising", will be understood to imply the inclusion of stated elements but not the exclusion of any other elements.

As used herein, when a definition is not otherwise provided, "substituted" refers to replacement of at least one hydrogen by deuterium, a halogen, a hydroxy group, a cyano group, a nitro group, —NRR' (wherein R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, C1 to C10 alkylsilyl group, a C3 to C30 cycloalkyl group, a C6 to C30 aryl group, a C1 to C20 alkoxy group, or a combination thereof. "Unsubstituted" refers to non-replacement of a hydrogen atom by another substituent and remaining.

As used herein, when a definition is not otherwise provided, "alkyl group" refers to a linear or branched aliphatic hydrocarbon group. The alkyl group may be "a saturated alkyl group" without any double bond or triple bond.

The alkyl group may be a C1 to C8 alkyl group. For example, the alkyl group may be a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, "a cycloalkyl group" refers to a monovalent cyclic aliphatic saturated hydrocarbon group.

The cycloalkyl group may be a C3 to C8 cycloalkyl group, for example, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As used herein, "aliphatic unsaturated organic group" refers to a hydrocarbon group including a bond in which the bond between the carbon and carbon atom in the molecule is a double bond, a triple bond, or a combination thereof.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As used herein, "aryl group" refers to a substituent in which all atoms in the cyclic substituent have a p-orbital and these p-orbitals are conjugated, and may include a monocyclic or fused ring polycyclic functional group (i.e., rings sharing adjacent pairs of carbon atoms).

As used herein, "heteroaryl group" refers to an aryl group including at least one heteroatom selected from N, O, S, P, or Si. Two or more heteroaryl groups are linked by a sigma bond directly, or when the heteroaryl group includes two or more rings, the two or more rings may be fused. When the heteroaryl group is a fused ring, each ring may include one to three heteroatoms.

As used herein, unless otherwise defined, "alkenyl group" refers to an aliphatic unsaturated alkenyl group including at least one double bond as a linear or branched aliphatic hydrocarbon group.

As used herein, unless otherwise defined, "alkynyl group" refers to an aliphatic unsaturated alkynyl group including at least one triple bond as a linear or branched aliphatic hydrocarbon group.

Unless otherwise specified in the present specification, the average molecular weight is measured by dissolving a powder sample in tetrahydrofuran (THF) and then using 1200 series Gel Permeation Chromatography (GPC) of Agilent Technologies (column is Shodex Company LF-804, standard sample is Shodex company polystyrene).

In addition, unless otherwise defined in the specification, "*" indicates a linking point of a structural unit or a compound moiety of a compound.

Hereinafter, photoresist compositions according to some example embodiments will be described.

A semiconductor photoresist composition according to an example embodiment may include an organometallic compound and a solvent, wherein the organometallic compound is represented by Chemical Formula 1.

[Chemical Formula 1]

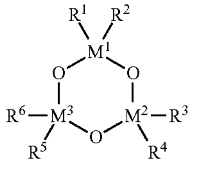

In Chemical Formula 1, $M^1$ to $M^3$ may each independently be one metal selected from Sn, Sb, Te, I, Ti, Bi, Po, At, In, Ag, Au, Pt, Si, Al, or Ga, $R^1$ to $R^6$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, a functional group containing at least one heteroatom selected from O, S, Si, N, Se, Te, P, Ge, Sn, Al, or In, or a combination thereof, and at least one of $R^1$ to $R^6$ is a functional group containing at least one heteroatom selected from O, S, Si, N, Se, Te, P, Ge, Sn, Al, or In.

The organometallic compound represented by Chemical Formula 1 is a 6-membered metal-organic framework and may be stable even in a monomolecular form, and may realize improved resolution due to its small molecular size. In addition, the metal in the organometallic compound represented by Chemical Formula 1 may be bonded to a functional group containing at least one heteroatom selected from O, S, Si, N, Se, Te, P, Ge, Sn, Al, or In, and thus, moisture stability may be high. A heteroatom of the one or more functional groups may have a structure in which a metal and a hetero bond are directly bonded.

An aforementioned organometallic compound represented by Chemical Formula 1 may have a stable hexagonal ring structure with no ionic bond, and may additionally coordinate with unshared electron pairs of a solvent in the solvent to form a cluster. Since moisture stability of this structure may be improved, an improved shelf life may be achieved. Furthermore, CD distribution between wafers may be controlled due to improved post coating delay (PCD) characteristics, and a yield of products may be improved.

The post coating delay is process-waiting time until a photoresist layer is exposed after coating the photoresist layer, during which moisture in the air reacts with the photoresist layer to cause CD fluctuations and thus deteriorate the yield. However, an example embodiment of a semiconductor photoresist composition according to the present disclosure may include an organometallic compound which is stable to the moisture and thus may prevent the CD fluctuations between wafers without changing properties of the photoresist layer during PCD.

An example embodiment of an organometallic compound may be represented by Chemical Formula 2.

[Chemical Formula 2]

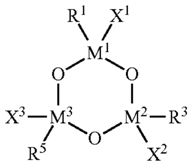

In Chemical Formula 2, $M^1$ to $M^3$ may each independently be one metal selected from Sn, Sb, Te, I, Ti, Bi, Po, At, In, Ag, Au, Pt, Si, Al, or Ga, $X^1$ to $X^3$ may each independently be a functional group containing at least one heteroatom selected from O, S, Si, N, Se, Te, P, Ge, Sn, Al, or In, and $R^1$, $R^3$, and $R^5$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, or a combination thereof.

For example, $X^1$ to $X^3$ may each independently be a functional group containing at least one heteroatom selected from O, S, P, or Si.

$X^1$ to $X^3$ may each independently be selected from O-L-$R^7$, OC(O)$R^8$, OSi($R^9$)($R^{10}$)($R^{11}$), OSi(O)$R^{12}$, OS(O)2$R^{13}$, or OP(O)$R^{14}$, L may be a single bond or a substituted or unsubstituted C1 to C10 alkylene group, and $R^7$ to $R^{14}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, $R^7$ to $R^{14}$ may each independently be hydrogen, a methyl group, an ethyl group, an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, a sec-octyl group, a tert-butyl group, a tert-pentyl group, a tert-hexyl group, a tert-heptyl group, a tert-octyl group, a tert-nonyl group, a tert-decyl group, a phenyl group, or a biphenyl group.

In an example embodiment, $X^1$ to $X^3$ may each independently be any one of the functional groups listed in Group 1.

[Group 1]

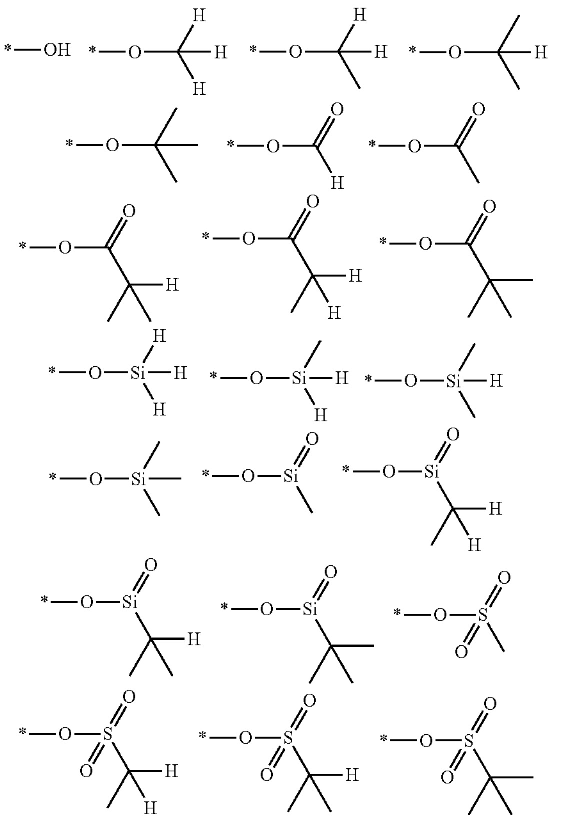

-continued

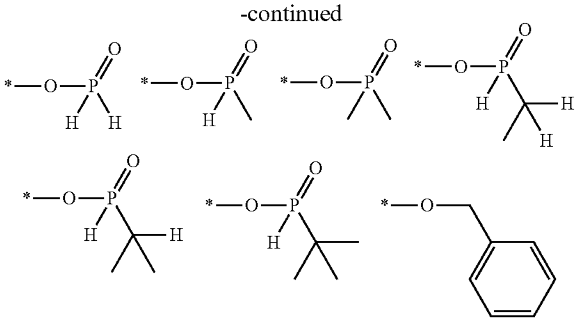

A solvent included in the semiconductor photoresist composition according to example embodiments may be one selected from an aromatic compound, alcohols, ethers, esters, ketones, naphtha, or a mixture thereof.

Since example embodiments of an organometallic compound may provide an additional coordination binding site for the unshared electron pair of the solvent at $M^1$ to $M^3$ in the solvent, an organometallic compound may form a cluster in which bonds between the organometallic compound and the solvent are induced.

Compared to general monomolecular forms, this cluster form is one in which the coordination number of the metal is satisfied due to additional coordination bonds and metal atoms are structurally hidden. Thus, moisture stability may be improved, and aggregation caused by a hydrolysis post-condensation reaction may be prevented to increase long-term storage stability. Accordingly, defects in the coating process may be reduced, which can affect coating stability.

In addition, as the aggregation phenomenon may be prevented, the cluster may be coated in an amorphous form without using an additive during spin coating, and thus sensitivity and coating properties may be improved.

The aromatic compounds may be, for example, benzene, xylene, or toluene.

The alcohols may be, for example, 4-methyl-2-pentanol, 4-methyl-2-propanol, 1-butanol, methanol, ethanol, isopropyl alcohol, 1-propanol, butanol, or the like.

The ethers may be, for example, dimethoxymethane, diethyl ether, methyl-tert-butyl ether, anisole, tetrahydrofuran, 2-methyl tetrahydrofuran, cyclopentyl methyl ether, dioxane, or the like.

The esters may be, for example, n-butyl acetate, propylene glycol monomethyl ether acetate, ethyl acetate, ethyl lactate, ethyl acetate, or the like.

The ketones may be, for example, acetone, methyl ethyl ketone, 2-heptanone, or the like.

On the other hand, an organometallic compound having a 6-membered ring structure may maintain stability and improved sensitivity. An organometallic compound having a linear structure has relatively low stability, and thus when left for a long period of time, problems such as a decrease in sensitivity may occur due to aggregation caused by a post-condensation reaction. In the case of the organometallic compound having the linear structure, after about 8 weeks, the sensitivity is decreased by 15% compared to the case of an organometallic compound having the 6-membered ring structure according to an example embodiment of the present disclosure.

An example embodiment of a semiconductor photoresist composition may further include cyclic polysiloxane.

The cyclic polysiloxane may be represented by Chemical Formula 20.

[Chemical Formula 20]

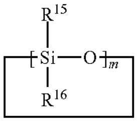

In Chemical Formula 20, $R^{15}$ and $R^{16}$ may each independently be a substituted or unsubstituted C1 to C20 alkyl group, a substituted or unsubstituted C2 to C20 alkenyl group, a substituted or unsubstituted C2 to C20 alkynyl group, or a combination thereof, and m is an integer of 2 to 10.

When the cyclic polysiloxane is further included, cross-linking reactivity may be increased, and the EOP may be reduced, improving a sensitivity effect.

In addition, stability of the thin film may be improved because a binding force is improved due to strengthened bonding within the substrate.

For example, m may be an integer of 3 to 5, and for example, it may be selected from compounds listed in Group 7, but is not limited thereto.

[Group 7]

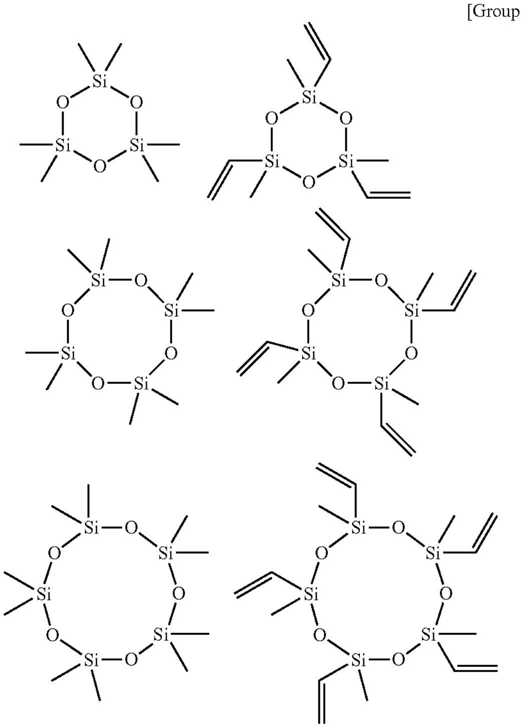

Example embodiments of cyclic polysiloxane may be included in an amount of about 10 parts by weight to about 90 parts by weight based on about 100 parts by weight of the organometallic compound. For example, the cyclic polysiloxane may be included in an amount of about 10 parts by weight to about 80 parts by weight or about 10 parts by weight to about 70 parts by weight based on about 100 parts by weight of the organometallic compound.

When the cyclic polysiloxane is included within the ranges, the EOP reduction effect may be improved.

At least one of $M^1$ to $M^3$ may be Sn.

Each of $M^1$ to $M^3$ may be Sn.

Since the Sn (tin) intensively absorbs extreme ultraviolet (EUV) at about 13.5 nm, an organometallic compound including the same may have improved sensitivity to light with high energy, and accordingly, the organometallic compound according to example embodiments may exhibit improved stability and sensitivity, compared with a conventional organic and/or inorganic resist.

$R^1$, $R^3$, and $R^5$ of Chemical Formula 2 may be bonded to a metal such as tin, antimony, or the like to form a metal-organic bond, thereby imparting organic solubility for a solvent to the organometallic compound.

Since the X-M bond is relatively strong, a semiconductor photoresist composition including the organometallic compound including the X-M bond according to an example embodiment may exhibit improved storage stability and solubility. In addition, since the X-M bond has relatively low bond dissociation energy to extreme ultraviolet (EUV) exposure, an organometallic compound including the same may have improved sensitivity.

Accordingly, the semiconductor photoresist composition including the organometallic compound including the X-M bond may be easy to handle and exhibit improved storage stability and solubility characteristics and improved sensitivity.

The organometallic compound may be represented by any one of Chemical Formula 3 to Chemical Formula 8.

[Chemical Formula 3]

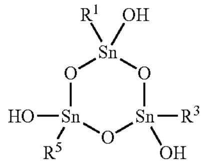

[Chemical Formula 4]

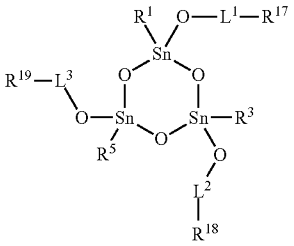

[Chemical Formula 5]

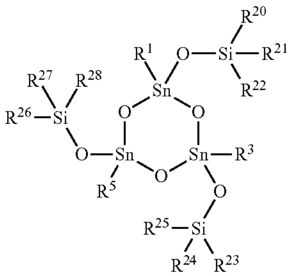

[Chemical Formula 6]

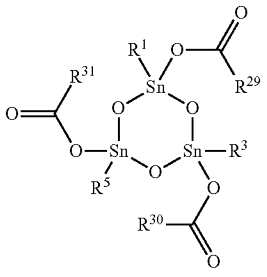

-continued

[Chemical Formula 7]

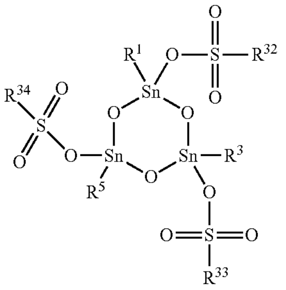

[Chemical Formula 8]

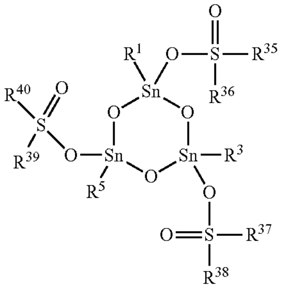

In Chemical Formula 3 to Chemical Formula 8, $R^1$, $R^3$, $R^5$, and $R^{17}$ to $R^{34}$ may each independently be a substituted or unsubstituted C1 to C10 alkyl group or a substituted or unsubstituted C6 to C12 aryl group, and $R^{35}$ to $R^{40}$ may each independently be a hydrogen, a substituted or unsubstituted C1 to C10 alkyl group, or a substituted or unsubstituted C6 to C12 aryl group.

An example embodiment of an organometallic compound may be any one of those listed in Group 2.

[Group 2]

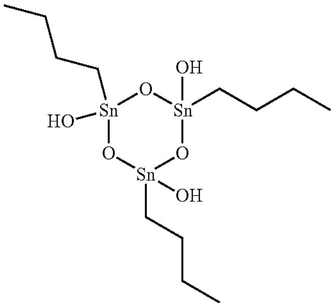

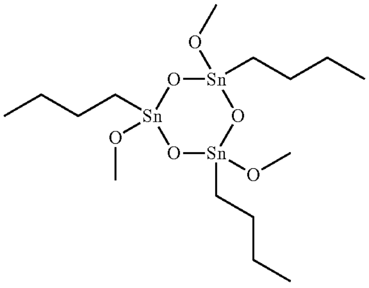

-continued

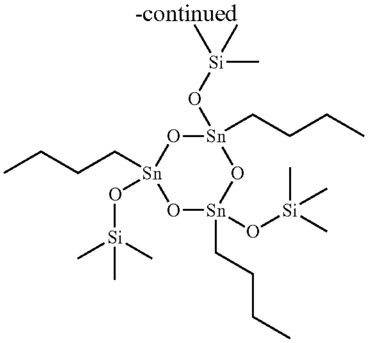

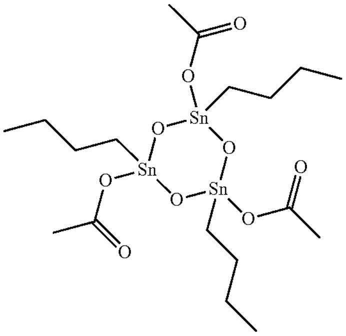

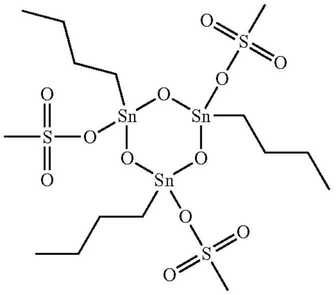

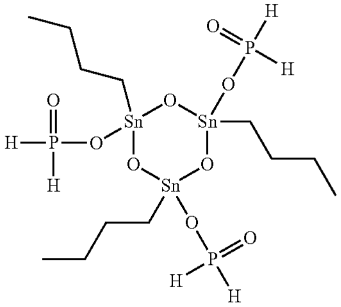

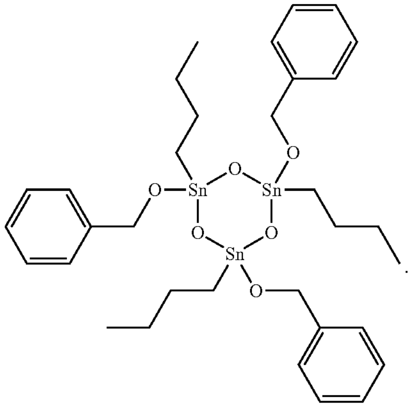

Example embodiments of the aforementioned organometallic compound may be prepared according to several methods, and a final synthesized product may be obtained by concentrating a solvent under a reduced pressure. Recrystallization may be performed through heating and then cooling a solvent. The recrystallization solvent may be methanol, ethanol, acetone, acetonitrile, ethyl acetate, toluene, hexane, heptane, or the like. In addition, another recrystallization method may be to obtain a product through precipitation, which may in general occur according to a solubility difference for a solvent. A solvent suitable for precipitation may include hydrocarbons (aliphatic hydrocarbons such as pentane, hexane, heptane, and octane; alicyclic hydrocarbons such as cyclohexane and methylcyclohexane; and aromatic hydrocarbons such as benzene, toluene, and xylene); halogenated hydrocarbons (aliphatic halogenated hydrocarbons such as methylene chloride, chloroform, and carbon tetrachloride; and aromatic halogenated hydrocarbons such as chlorobenzene and dichlorobenzene); nitro compounds (such as nitromethane and nitroethane); nitriles (such as acetonitrile and benzonitrile); ethers (linear ethers such as diethyl ether, diisopropyl ether, and dimethoxyethane; and cyclic ethers such as tetrahydrofuran and dioxane); ketones (such as acetone, methyl ethyl ketone, and diisobutyl ketone); esters (such as ethyl acetate and butyl acetate); carbonates (such as dimethyl carbonate, diethyl carbonate, ethylene carbonate, and propylene carbonate); alcohols (such as methanol, ethanol, propanol, isopropyl alcohol, and butanol); carboxylic acids (such as acetic acid); water; or a combination thereof, but is not limited thereto. An amount of precipitation or reprecipitation solvent used may be appropriately selected in consideration of efficiency and yield.

The final product synthesized through the concentration under a reduced pressure, the recrystallization, or the like may be an organometallic compound with the structure of Chemical Formula 3.

As another example embodiment, an example embodiment of the organometallic compound having the structure of Chemical Formula 4 may be prepared through a substitution reaction between the organometallic compound having the structure of Chemical Formula 3 and an alkyl iodide (e.g., having 1 to 10 carbon atoms).

The substitution reaction may be performed in a state where the alkyl iodide is dissolved in a solvent, and the solvent that may be used for the substitution reaction may include N-methyl-2-pyrrolidone (NMR), dimethyl formamide (N,N-dimethylformamide, DMF), dimethyl acetamide (N,N-dimethylacetamide, DMAc), dimethylsulfoxide (DMSO), dichlorobenzene, mesitylene, benzylalcohol, amyl alcohol, or a combination thereof, but is not limited thereto.

The reaction molar ratio of the alkyl iodide to an example embodiment of an organometallic compound represented by Chemical Formula 3 may be about 1 to about 18, for example about 3 to about 12.

Example embodiments of the alkyl iodide include compounds listed in Group 3, but are not limited thereto.

[Group 3]

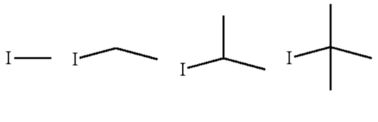

A temperature of the substitution reaction may be selected to be below a boiling point of the solvent, and time may be selected based on a solubility degree of reactants. The substitution reaction may be performed for about 30 minutes or more, for example for about 1 hour or more, or for about 90 minutes to 24 hours.

In addition, a basic catalyst may be used to promote the substitution reaction. For example, the basic catalyst may be selected from sodium hydroxide, triethylamine, tripropylamine, n-butylamine, n-butylamine, tri-n-butylamine, imidazole, pyridine, 3-methylpyridine, 4-dimethylaminopyridine, N,N-diisopropylethylamine, ammonium perchlorate, sodium hydroxide, sodium carbonate, potassium hydroxide, barium hydroxide, or a combination thereof.

An example embodiment of an organometallic compound represented by Chemical Formula 4 may be obtained by precipitation. An example embodiment of an organometallic compound represented by Chemical Formula 4 may be generally precipitated according to a difference in solubility in a solvent. A solvent suitable for precipitation may include hydrocarbons (aliphatic hydrocarbons such as pentane, hexane, heptane, and octane; alicyclic hydrocarbons such as cyclohexane and methylcyclohexane; and aromatic hydrocarbons such as benzene, toluene, and xylene); halogenated hydrocarbons (aliphatic halogenated hydrocarbons such as methylene chloride, chloroform, and carbon tetrachloride; and aromatic halogenated hydrocarbons such as chlorobenzene and dichlorobenzene); nitro compounds (such as nitromethane and nitroethane); nitriles (such as acetonitrile and benzonitrile); ethers (linear ethers such as diethyl ether, diisopropyl ether, and dimethoxyethane; and cyclic ethers such as tetrahydrofuran and dioxane); ketones (such as acetone, methyl ethyl ketone, and diisobutyl ketone); esters (such as ethyl acetate and butyl acetate); carbonates (such as dimethyl carbonate, diethyl carbonate, ethylene carbonate, and propylene carbonate); alcohols (such as methanol, ethanol, propanol, isopropyl alcohol, and butanol); carboxylic acids (such as acetic acid); water; or a combination thereof, but is not limited thereto. An amount of precipitation or reprecipitation solvent used may be appropriately selected in consideration of efficiency and yield.

As another example embodiment, an organometallic compound having the structure of Chemical Formula 5 may be prepared through a substitution reaction between the organometallic compound having the structure of Chemical Formula 3 and a silyl compound having the structure of Chemical Formula 7 or Chemical Formula 8.

[Chemical Formula 7]

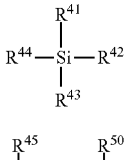

[Chemical Formula 8]

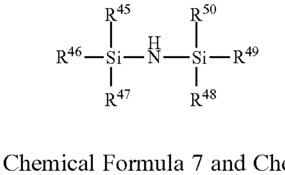

In Chemical Formula 7 and Chemical Formula 8, $R^{41}$ to $R^{50}$ may each independently be a halogen, a substituted or unsubstituted C1 to C10 alkyl group, a substituted or unsubstituted C1 to C10 alkoxy group, a substituted or unsubstituted C6 to C20 aryl group, or a combination thereof.

The substitution reaction may be performed in a state in which the silyl compound having the structure of Chemical Formula 7 or Chemical Formula 8 may be dissolved in a solvent, and the solvent used for the substitution reaction may be as described above.

The reaction molar ratio of an organometallic compound represented by Chemical Formula 3 to the silyl compound having the structure of Chemical Formula 7 or Chemical Formula 8 may be about 1 to about 18, for example about 3 to about 12.

Example embodiments of the silyl compound include compounds listed in Group 4, but are not limited thereto.

[Group 4]

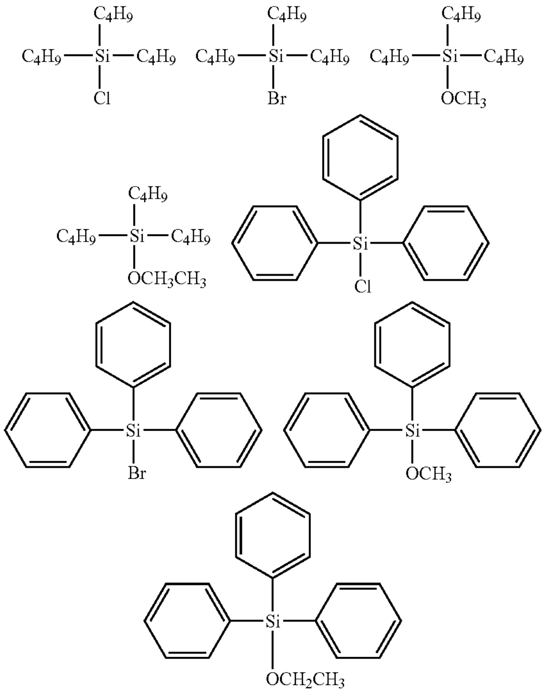

The temperature of the substitution reaction may be selected to be below the boiling point of the solvent, and the time may be selected based on a solubility degree of reactants. In general, the substitution reaction may be performed for about 30 minutes or more, for example for about 1 hour or more, or for about 90 minutes to about 24 hours.

Also, a halogen catalyst may be used to promote the substitution reaction. For example, the catalyst may be selected from fluorine, chlorine, bromine, and iodine, or a combination thereof. As a final product of the substitution reaction, an example embodiment of an organometallic compound represented by Chemical Formula 5 may be obtained by precipitation, and it is generally precipitated according to a difference in solubility in a solvent. A solvent suitable for precipitation is as described above.

As another example embodiment, an organometallic compound having the structure of Chemical Formula 6 may be prepared through a substitution reaction between the organometallic compound having the structure of Chemical Formula 3 and an acetoxy compound having the structure of Chemical Formula 9.

[Chemical Formula 9]

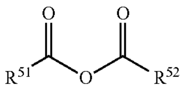

In Chemical Formula 9, $R^{51}$ and $R^{52}$ may each independently be a substituted or unsubstituted C1 to C10 alkyl group.

The substitution reaction may be performed in a state where the acetoxy compound having the structure of Chemical Formula 9 is dissolved in a solvent, and the solvent used for the substitution reaction is as described above.

A reaction molar ratio of the acetoxy compound having the structure of Chemical Formula 9 to the organometallic compound represented by Chemical Formula 3 may be about 1 to about 18, for example about 3 to about 12.

Example embodiments of the acetoxy compound include compounds listed in Group 5, but are not limited thereto.

[Group 5]

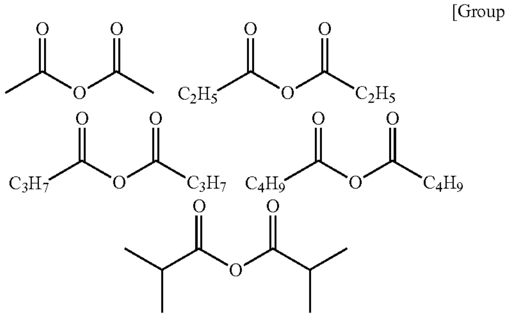

In addition, a basic catalyst may be used to promote the substitution reaction. Example embodiments of the basic catalyst are as described above.

As a final product of the substitution reaction, an example embodiment of an organometallic compound represented by Chemical Formula 6 may be obtained by precipitation, and may precipitated according to a difference in solubility in a solvent. A solvent suitable for precipitation is as described above.

In the semiconductor photoresist composition according to an example embodiment, based on about 100 weight percent of the semiconductor photoresist composition, the organotin compound may be included in an amount of about 1 weight percent to about 30 weight percent, for example, about 1 weight percent to about 25 weight percent, for example, about 1 weight percent to about 20 weight percent, for example, about 1 weight percent to about 15 weight percent, for example, about 1 weight percent to about 10 weight percent, or for example, about 1 weight percent to about 5 weight percent, but is not limited thereto. When an example embodiment of an organometallic compound such as that represented by Chemical Formula 1 is included within the ranges, the semiconductor photoresist composition including the same may exhibit improved storage-stability and solubility characteristics, may be easily formed into a thin film, and may exhibit improved sensitivity and resolution characteristics.

A semiconductor photoresist composition according to example embodiments may include the aforementioned organometallic compound, providing a semiconductor photoresist composition with improved sensitivity and pattern-forming ability.

An example embodiment of a semiconductor photoresist composition may further include a resin in addition to the aforementioned organometallic compound and solvent.

An example embodiment of a resin may be a phenolic resin containing at least one of the aromatic moieties listed in Group 6.

[Group 6]

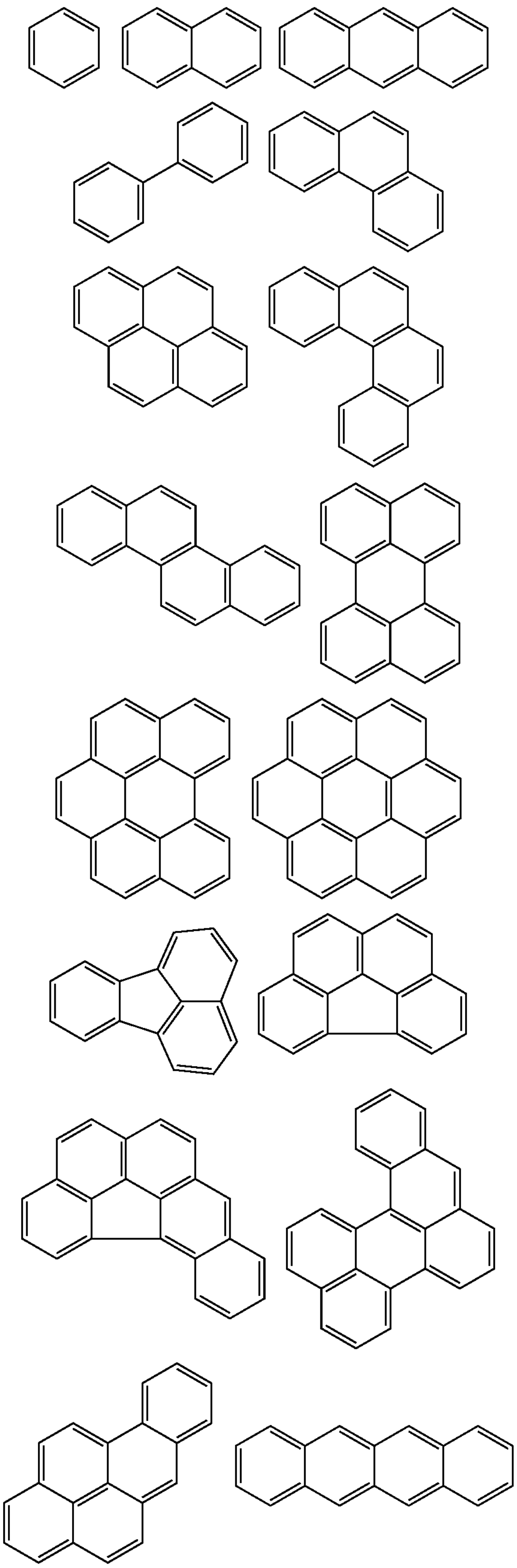

-continued

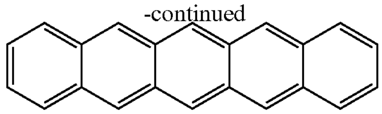

The resin may have an average molecular weight of about 500 to about 20,000 Daltons.

The resin may be included in an amount of about 0.1 weight percent to about 50 weight percent based on the total amount of the semiconductor photoresist composition.

When the resin is included in the above content range, it may have improved corrosion resistance and heat resistance.

In addition, the semiconductor resist composition according to an example embodiment may further include an additive as needed. Example embodiments of the additive may include a surfactant, a crosslinking agent, a leveling agent, an organic acid, a quencher, or a combination thereof.

The surfactant may include, for example, an alkylbenzenesulfonic acid salt, an alkylpyridinium salt, polyethylene glycol, a quaternary ammonium salt, or a combination thereof, but is not limited thereto.

The crosslinking agent may include, for example, a melamine-based crosslinking agent, a substituted urea-based crosslinking agent, an acryl-based crosslinking agent, an epoxy-based crosslinking agent, or a polymer-based crosslinking agent, but is not limited thereto. The crosslinking agent may be a crosslinking agent having at least two crosslinking substituents, for example compounds such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trim ethyl propane triglycidyl ether, 1,3-bis(glycidoxypropyl)tetramethyldisiloxane, methoxymethylated urea, butoxymethylated urea, or methoxymethylated thiourea.

The leveling agent may improve coating flatness during printing, and a leveling agent available through a commercial method may be used.

The organic acid may include p-toluenesulfonic acid, benzenesulfonic acid, p-dodecylbenzenesulfonic acid, 1,4-naphthalenedisulfonic acid, methanesulfonic acid, a fluorinated sulfonium salt, malonic acid, citric acid, propionic acid, methacrylic acid, oxalic acid, lactic acid, glycolic acid, succinic acid, or a combination thereof, but is not limited thereto.

The quencher may be diphenyl(p-toyl) amine, methyl diphenyl amine, triphenyl amine, phenylenediamine, naphthylamine, diaminonaphthalene, or a combination thereof.

An amount of the additive used may be easily adjusted according to desired physical properties, and the additive may be omitted.

In addition, the semiconductor photoresist composition may further include a silane coupling agent to enhance adherence with a substrate of the semiconductor photoresist composition and improve a close-contacting force with a substrate. For example, a silane coupling agent may be a silane compound including a carbon-carbon unsaturated bond such as vinyltrimethoxysilane, vinyltriethoxysilane, vinyl trichlorosilane, vinyltris(3-methoxyethoxy)silane; or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl] silane; or the like, but is not limited thereto.

An example embodiment of a semiconductor photoresist composition may be formed into a pattern having a high aspect ratio without a collapse. Accordingly, a fine pattern may have a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm. An example embodiment of a semiconductor photoresist composition may be used for a photoresist process using light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an example embodiment may be used to realize extreme ultraviolet (EUV) lithography using an EUV light source of a wavelength of about 13.5 nm.

According to example embodiments, a method of forming patterns using the semiconductor photoresist composition is provided. For example, the manufactured pattern may be a photoresist pattern.

Methods of forming patterns according to example embodiments include forming an etching subject layer on a substrate, coating the semiconductor photoresist composition on the etching subject layer to form a photoresist layer, patterning the photoresist layer to form a photoresist pattern, and etching the etching subject layer using the photoresist pattern as an etching mask.

Hereinafter, example embodiments of methods of forming patterns using the semiconductor photoresist composition are described referring to FIGS. 1 to 5. FIGS. 1 to 5 are cross-sectional views for explaining a method of forming patterns using a semiconductor photoresist composition according to example embodiments.

Referring to FIG. 1, a subject for etching is prepared. The etching subject may be a thin film 102 disposed on a semiconductor substrate 100. Hereinafter, the etching subject is discussed in reference to the thin film 102. However, an embodiment is not necessarily limited thereto. A surface of the thin film 102 may be washed to remove impurities and the like remaining thereon. The thin film 102 may be for example a silicon nitride layer, a polysilicon layer, or a silicon oxide layer.

The resist underlayer composition for forming a resist underlayer 104 may be spin-coated on the surface of the washed thin film 102. However, example embodiments are not necessarily limited thereto, but various coating methods such as spray coating, dip coating, knife edge coating, printing, for example, inkjet printing, screen printing, and the like may be used.

The coating process of the resist underlayer 104 may be omitted, and hereinafter, a process including a coating of the resist underlayer 104 is described.

The coated composition is dried and baked to form a resist underlayer 104 on the thin film 102. The baking may be performed at about 100° C. to about 500° C., for example, about 100° C. to about 300° C.

The resist underlayer 104 may be formed between the semiconductor substrate 100 and a photoresist layer 106 and thus may prevent non-uniformity and pattern-forming ability of a photoresist line width when a ray reflected from on the interface between the semiconductor substrate 100 and the photoresist layer 106 or when a hardmask between layers is scattered into an unintended photoresist region.

Figure 2:
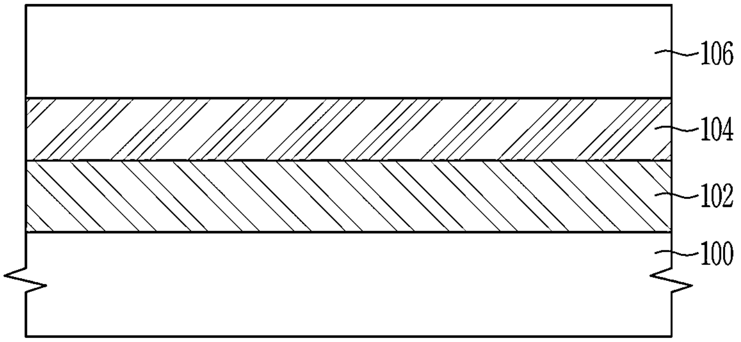

Referring to FIG. 2, the photoresist layer 106 may be formed by coating the semiconductor photoresist composition on the resist underlayer 104. The photoresist layer 106 may be obtained by coating the semiconductor photoresist composition on the thin film 102 disposed on the semiconductor substrate 100 and then, curing it through a heat treatment.

According to an example embodiment, forming a pattern by using the semiconductor resist composition may include coating the semiconductor resist composition on the semiconductor substrate 100 having the thin film 102 through spin coating, slit coating, inkjet printing, and the like, and then drying it to form the photoresist layer 106.

The semiconductor photoresist composition has already been illustrated in detail and will not be illustrated again.

Subsequently, a semiconductor substrate 100 having the photoresist layer 106 may be subjected to a first baking process. The first baking process may be performed at about 80° C. to about 180° C., for about 30 seconds to about 3 minutes.

Figure 3:
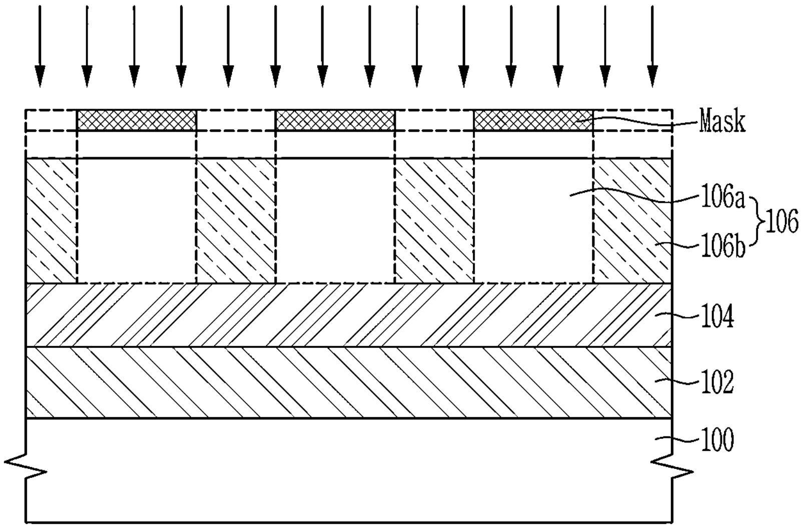

Referring to FIG. 3, the photoresist layer 106 may be selectively exposed.

For example, the exposure may use an activation radiation with light having a high energy wavelength such as EUV (Extreme UltraViolet; a wavelength of about 13.5 nm), an E-Beam (an electron beam), or the like as well as a short wavelength such as an i-line (a wavelength of about 365 nm), a KrF excimer laser (a wavelength of about 248 nm), an ArF excimer laser (a wavelength of about 193 nm), or the like.

Light for the exposure according to an example embodiment may have a short wavelength ranging from about 5 nm to about 150 nm and a high energy wavelength, for example, EUV (Extreme UltraViolet; a wavelength of about 13.5 nm), an E-Beam (an electron beam), or the like.

An exposed region 106*a* of the photoresist layer 106 may have a different solubility from that of a non-exposed region 106*b* of the photoresist layer 106, as a polymer is formed by a crosslinking reaction such as condensation between organometallic compounds.

Subsequently, the semiconductor substrate 100 may be subjected to a second baking process. The second baking process may be performed at a temperature of about 90° C. to about 200° C. for about 30 seconds to about 3 minutes. The exposed region 106*a* of the photoresist layer 106 becomes easily indissoluble regarding a developer due to the second baking process.

Figure 4:
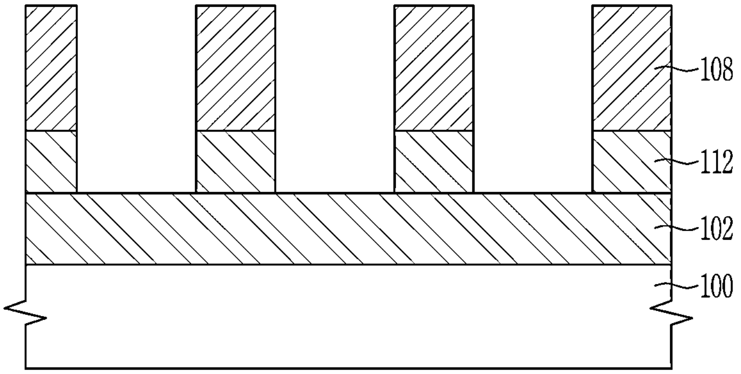

In FIG. 4, the non-exposed region 106*b* of the photoresist layer may be dissolved and removed using the developer to form a photoresist pattern 108. Specifically, the non-exposed region 106*b* of the photoresist layer may be dissolved and removed by using an organic solvent such as 2-heptanone and the like to complete the photoresist pattern 108 corresponding to the negative tone image.

As described above, a developer used in a method of forming patterns according to an example embodiment may be an organic solvent. The organic solvent used in the method of forming patterns according to example embodiments may be for example ketones such as methylethylketone, acetone, cyclohexanone, 2-heptanone, and the like, alcohols such as 4-methyl-2-propanol, 1-butanol, isopropanol, 1-propanol, methanol, and the like, esters such as propylene glycol monomethyl ether acetate, ethyl acetate, ethyl lactate, n-butyl acetate, butyrolactone, and the like, aromatic compounds such as benzene, xylene, toluene, and the like, or a combination thereof. Alternatively, it may be an organic solvent in which an acidic substance or a basic substance is mixed in an amount of less than or equal to about 9 weight percent.

However, a photoresist pattern according to example embodiments is not necessarily limited to the negative tone image but may be formed to have a positive tone image. Herein, a developing agent used for forming the positive tone image may be a quaternary ammonium hydroxide composition such as tetraethylammonium hydroxide, tetrapropylammonium hydroxide, tetrabutylammonium hydroxide, or a combination thereof.

As described above, when the activation radiation is performed by using light having a high energy such as EUV (Extreme UltraViolet; a wavelength of about 13.5 nm), an E-Beam (an electron beam), or the like as well as a short wavelength such as an i-line (a wavelength of about 365 nm), a KrF excimer laser (a wavelength of about 248 nm), an ArF excimer laser (a wavelength of about 193 nm), or the like, the photoresist pattern 108 may have a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm.

On the other hand, the photoresist pattern 108 may have a pitch having a half-pitch of less than equal to about 50 nm, for example less than equal to about 40 nm, for example less than equal to about 30 nm, for example less than equal to about 20 nm, or for example less than equal to about 15 nm, and line width roughness of less than equal to about 10 nm, less than equal to about 5 nm, less than equal to about 3 nm, or less than equal to about 2 nm.

Subsequently, the photoresist pattern 108 may be used as an etching mask to etch the resist underlayer 104. Through this etching process, an organic film pattern 112 is formed. The organic film pattern 112 also may have a width corresponding to that of the photoresist pattern 108.

Figure 5:
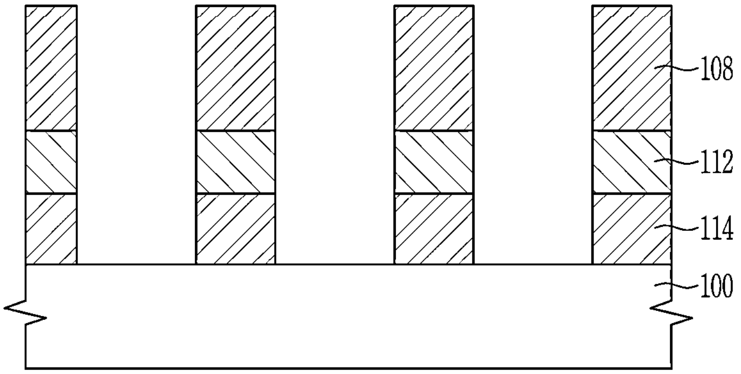

Referring to FIG. 5, the photoresist pattern 108 may be applied as an etching mask to etch the exposed thin film 102. As a result, a thin film may be formed with a thin film pattern 114.

The etching of the thin film 102 may be, for example, dry etching using an etching gas. The etching gas may be for example $CHF_3$, $CF_4$, $Cl_2$, $BC_3$, or a mixed gas thereof.

In the exposure process, the thin film pattern 114 may be formed by using the photoresist pattern 108 formed through the exposure process performed by using an EUV light source having a width corresponding to that of the photoresist pattern 108. For example, the thin film pattern 114 may have a width of about 5 nm to about 100 nm which is equal to that of the photoresist pattern 108. For example, according to some example embodiments, thin film pattern 114 formed by using the photoresist pattern 108 formed through the exposure process performed by using an EUV light source may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm, or specifically, less than or equal to about 20 nm like that of the photoresist pattern 108.

Hereinafter, the present disclosure is described in more detail through example embodiments regarding the preparation of aforementioned semiconductor photoresist compositions. However, the technical features of the present disclosure are not limited by the following examples.

Synthesis of Organometallic Compounds

Synthesis Example 1

A 2 L double-jacketed reactor was equipped with a magnetic stirrer and purged with Ar. Tetrahydrofuran was put in the reactor, and butyl tin trichloride was added thereto and then stirred. Subsequently, tetrahydrofuran, water, and a catalyst were added thereto and then heated to 40° C. After stirring for 2 days, the resultant was cooled to room temperature. After filtering the reaction solution with Celite, a solvent was evaporated therefrom under a reduced pressure, obtaining a compound represented by Chemical Formula 10.

[Chemical Formula 10]

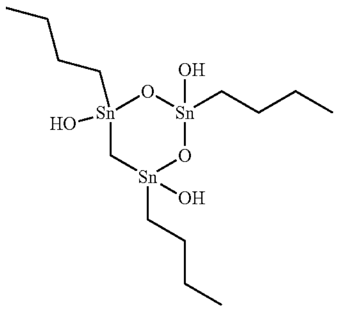

Synthesis Example 2

The organometallic compound synthesized in Synthesis Example 1 was dissolved in tetrahydrofuran, and methyl iodide was added thereto. A catalyst was added thereto and then stirred for 2 hours at room temperature. After filtering the reaction solution with Celite, a solvent was evaporated therefrom under a reduced pressure, obtaining a compound represented by Chemical Formula 11.

[Chemical Formula 11]

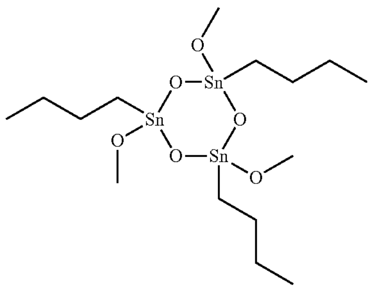

Synthesis Example 3

The organometallic compound synthesized in Synthesis Example 1 and iodine were dissolved in dimethyl dichloride. A solution prepared by dissolving trimethylsilylamine in dimethyldichloride was slowly added thereto in a dropwise fashion. The obtained mixture was stirred for 2 hours at room temperature, and sodium thiosulfulfate was added thereto and then additionally stirred for 30 minutes. When a reaction was completed, the reaction solution was filtered with silica and then recrystallized in heptane, obtaining a compound represented by Chemical Formula 12 in a powder state.

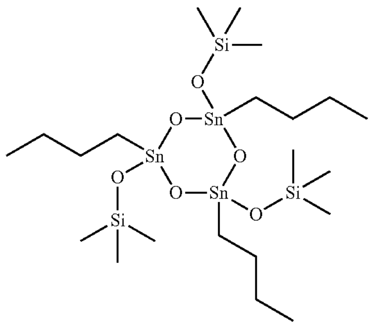 [SMILES: CCC[CH2][Sn]1([O][Si](C)(C)C)[O][Sn]([CH2]CCC)([O][Si](C)(C)C)[O][Sn]([CH2]CCC)([O][Si](C)(C)C)[O]1]

Synthesis Example 4

The organometallic compound obtained in Synthesis Example 1 was dissolved in tetrahydrofuran, and acetic anhydride was added thereto. A catalyst was added thereto and then stirred for 2 hours at room temperature. After filtering the reaction solution with Celite, a solvent was evaporated therefrom under a reduced pressure, obtaining a compound represented by Chemical Formula 13.

[Chemical Formula 13]

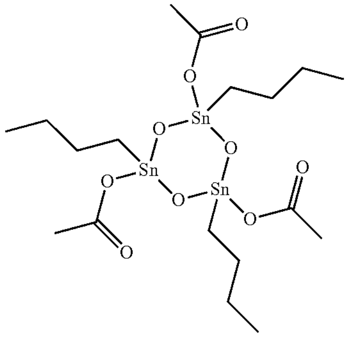

Synthesis Example 5

The organometallic compound obtained in Synthesis Example 1 was dissolved in tetrahydrofuran, and methanesulfonyl chloride was added thereto. A catalyst was added thereto and then, stirred for 2 hours at room temperature. After filtering the reaction solution with Celite, a solvent was evaporated therefrom under a reduced pressure, obtaining a compound represented by Chemical Formula 14.

[Chemical Formula 14]

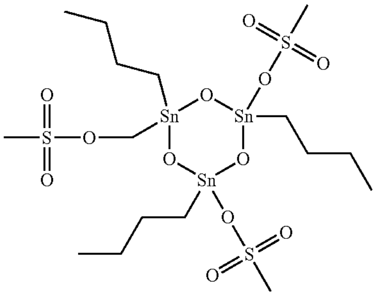

Synthesis Example 6

The organometallic compound obtained in Synthesis Example 1 was dissolved in tetrahydrofuran, and hyphosphorous acid was added thereto. A catalyst was added thereto and then stirred for 2 hours at room temperature. After filtering the reaction solution with Celite, a solvent was evaporated therefrom under a reduced pressure, obtaining a compound represented by Chemical Formula 15.

[Chemical Formula 15]

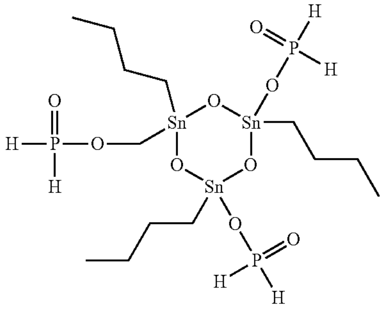

Synthesis Example 7

The organometallic compound obtained in Synthesis Example 1 was dissolved in tetrahydrofuran, and benzyl bromide was added thereto. A catalyst was added thereto and then stirred for 2 hours at room temperature. After filtering the reaction solution with Celite, a solvent was evaporated therefrom under a reduced pressure, obtaining a compound represented by Chemical Formula 16.

[Chemical Formula 16]

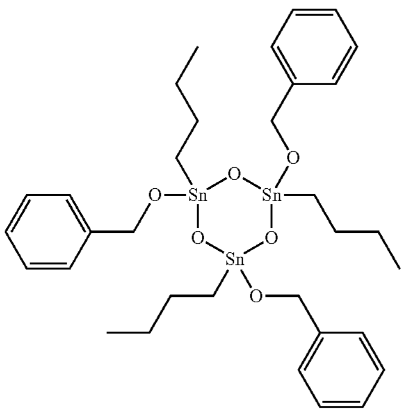

Preparation of Photoresist Compositions

Examples 1 to 7

The organometallic compounds according to Synthesis Examples 1 to 7 were respectively dissolved at 3 weight percent in PGMEA (propylene glycol monomethyl ether acetate) and then filtered with a 0.1 μm PTFE syringe filter, preparing each photoresist composition.

Evaluation 1: Evaluation of Pattern-Forming Ability

A circular silicon wafer with a diameter of 4 inches and with a native-oxide surface was used as a substrate for coating a thin film and treated in a UV ozone cleaning system for 10 minutes before coating the thin film. Subsequently, the semiconductor photoresist compositions according to Examples 1 to 4 were respectively spin-coated on the treated substrate at 1500 rpm for 60 seconds and then baked (post-apply baking (PAB)) at 100° C. for 60 seconds to form a 25 nm-thick photoresist thin film.

Figure 6:
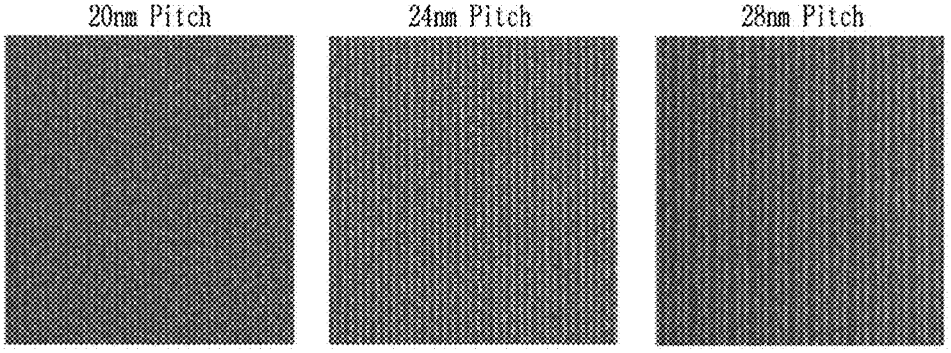
FIG. 6 shows a 20 nm pitch L/S pattern, a 24 nm pitch L/S pattern, and a 28 nm pitch L/S pattern.

Then, the coated substrate was exposed by irradiating extreme ultraviolet (EUV) at 102.5 mJ/$cm^2$ with a MET5 exposer from Lawrence Berkeley National Laboratory, post-exposure baked (PEB) at 160° C. for 60 seconds, and developed in a PGMEA developer for 30 seconds, forming 20 nm/24 nm/28 nm pitch L/S patterns, which are shown in FIG. 6.

FIG. 6 shows a 20 nm pitch L/S pattern, a 24 nm pitch L/S pattern, and a 28 nm pitch L/S pattern.

Referring to FIG. 6, uniform patterns were formed, which exhibits that the patterns had high resolution when the compositions according to the present disclosure were applied.

Evaluation 2: Evaluation of Storage Stability

Figure 7:
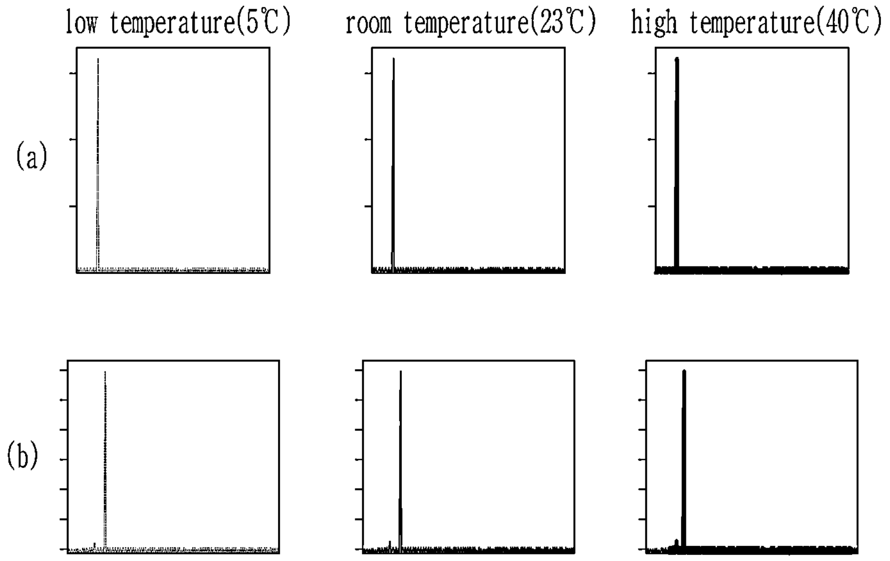
FIG. 7 shows the results observed with the MALDI-TOF mass spectrometer of an example embodiment of a semiconductor photoresist composition after standing for 2 weeks and 7 weeks.

With respect to the photoresist composition according to Example 1, the semiconductor photoresist composition was allowed to stand for 7 weeks at a low temperature (5±5° C.), room temperature (20±5° C.), and a high temperature (40±5° C.) to observe whether or not a molecular weight increased at the second week (a) and the seventh week (b) by using an MALDI-TOF mass spectrometer, and the results are shown in FIG. 7.

FIG. 7 shows the results observed with the MALDI-TOF mass spectrometer.

Referring to FIG. 7, since there was no molecular weight change, while allowed to stand at the low temperature, the room temperature, and the high temperature for 2 weeks to 7 weeks, the semiconductor photoresist composition according to the present disclosure was stable to moisture and thus exhibited a satisfactory shelf life.

Hereinbefore, certain example embodiments have been described and illustrated. However, it is apparent to a person with ordinary skill in the art that the present disclosure is not limited to the example embodiments as described, and may be variously modified and transformed without departing from the spirit and scope of the present disclosure. Accordingly, the modified or transformed example embodiments as such may not be understood separately from the technical ideas and aspects of the present disclosure, and the modified example embodiments are within the scope of the claims of the present disclosure.

What is claimed is:

1. A semiconductor photoresist composition, comprising an organometallic compound represented by Chemical Formula 1, and a solvent:

[Chemical Formula 1]

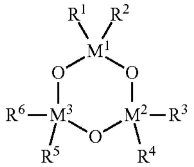

wherein, in Chemical Formula 1, $M^1$ to $M^3$ are each independently one metal selected from Sn, Sb, Te, I, Ti, Bi, Po, At, In, Ag, Au, Pt, Si, Al, or Ga, $R^1$ to $R^6$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, a functional group containing at least one heteroatom selected from O, S, Si, N, Se, Te, P, Ge, Sn, Al, or In, or a combination thereof, and at least one of $R^1$ to $R^6$ is a functional group containing at least one heteroatom selected from O, S, Si, N, Se, Te, P, Ge, Sn, Al, or In.

2. The semiconductor photoresist composition of claim 1, wherein the organometallic compound is represented by Chemical Formula 2:

[Chemical Formula 2]

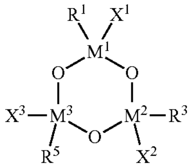

wherein, in Chemical Formula 2, $M^1$ to $M^3$ are each independently one metal selected from Sn, Sb, Te, I, Ti, Bi, Po, At, In, Ag, Au, Pt, Si, Al, or Ga, $X^1$ to $X^3$ are each independently a functional group containing at least one heteroatom selected from O, S, Si, N, Se, Te, P, Ge, Sn, Al, or In, and $R^1$, $R^3$, and $R^5$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C3 to C20 cycloalkenyl group, a substituted or unsubstituted C2 to C20 alkynyl group, a substituted or unsubstituted C3 to C20 cycloalkynyl group, a substituted or unsubstituted C6 to C30 aryl group, or a combination thereof.

3. The semiconductor photoresist composition of claim 2, wherein $X^1$ to $X^3$ are each independently a functional group containing at least one heteroatom selected from O, S, P, or Si.

4. The semiconductor photoresist composition of claim 3, wherein $X^1$ to $X^3$ are each independently O-L-$R^7$, OC(O)$R^8$, OSi($R^9$)($R^{10}$)($R^{11}$), OSi(O)$R^{12}$, $OS(O)_2R^{13}$, or OP(O)$R^{14}$, L is a single bond or a substituted or unsubstituted C1 to C10 alkylene group, and $R^7$ to $R^{14}$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

5. The semiconductor photoresist composition of claim 4, wherein $R^7$ to $R^{14}$ are each independently hydrogen, a methyl group, an ethyl group, an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, a sec-octyl group, a tert-butyl group, a tert-pentyl group, a tert-hexyl group, a tert-heptyl group, a tert-octyl group, a tert-nonyl group, a tert-decyl group, a phenyl group, or a biphenyl group.

6. The semiconductor photoresist composition of claim 1, wherein the solvent is selected from an aromatic compound, alcohols, ethers, esters, ketones, naphtha, or a mixture thereof.

7. The semiconductor photoresist composition of claim 6, wherein the organometallic compound forms a cluster in the solvent.

8. The semiconductor photoresist composition of claim 1, wherein the semiconductor photoresist composition further includes cyclic polysiloxane.

9. The semiconductor photoresist composition of claim 8, wherein the cyclic polysiloxane is represented by Chemical Formula 20:

[Chemical Formula 20]

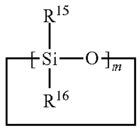

wherein, in Chemical Formula 20, $R^{15}$ and $R^{16}$ are each independently a substituted or unsubstituted C1 to C20 alkyl group, a substituted or unsubstituted C2 to C20 alkenyl group, a substituted or unsubstituted C2 to C20 alkynyl group, or a combination thereof, and m is an integer of 2 to 10.

10. The semiconductor photoresist composition of claim 8, wherein the cyclic polysiloxane is included in an amount of about 10 parts by weight to about 90 parts by weight based on 100 parts by weight of the organometallic compound.

11. The semiconductor photoresist composition of claim 1, wherein at least one of $M^1$ to $M^3$ is Sn.

12. The semiconductor photoresist composition of claim 1, wherein the organometallic compound is represented by any one of Chemical Formula 3 to Chemical Formula 8:

[Chemical Formula 3]

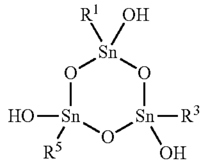

[Chemical Formula 4]

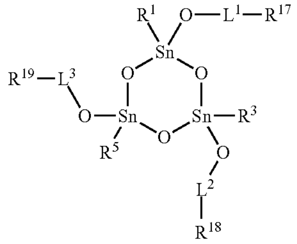

[Chemical Formula 5]

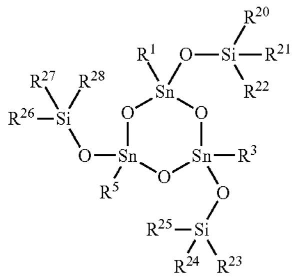

[Chemical Formula 6]

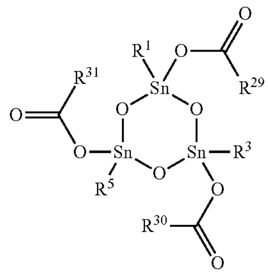

-continued

[Chemical Formula 7]

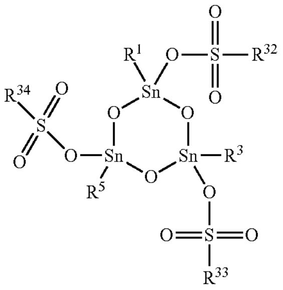

[Chemical Formula 8]

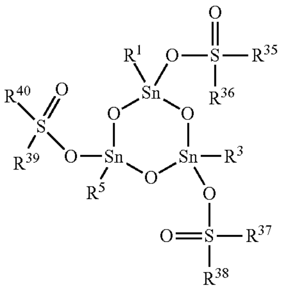

wherein, in Chemical Formula 3 to Chemical Formula 8, $R^1$, $R^3$, $R^5$, and $R^{17}$ to $R^{34}$ are each independently a substituted or unsubstituted C1 to C10 alkyl group or a substituted or unsubstituted C6 to C12 aryl group, and $R^{35}$ to $R^{40}$ are each independently hydrogen, a substituted or unsubstituted C1 to C10 alkyl group, or a substituted or unsubstituted C6 to C12 aryl group.

13. The semiconductor photoresist composition of claim 1, wherein the organometallic compound is any one of those listed in Group 2:

[Group 2]

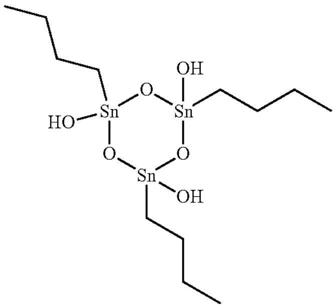

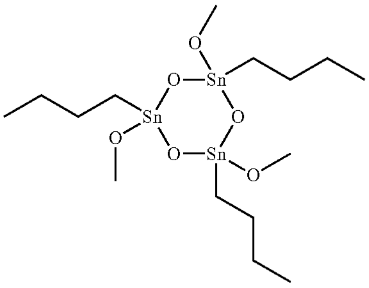

-continued

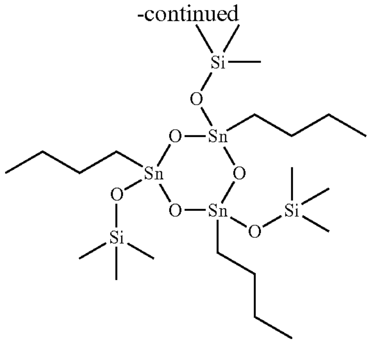

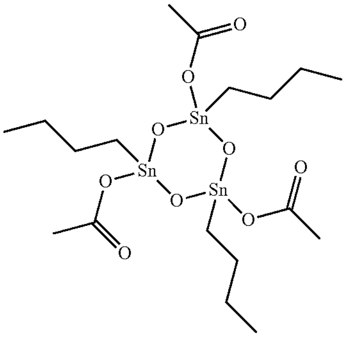

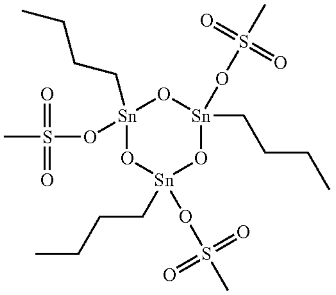

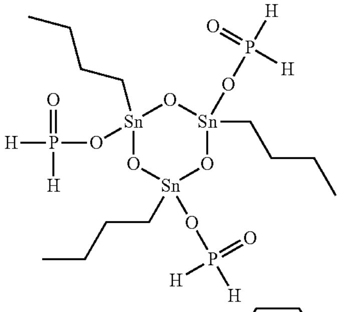

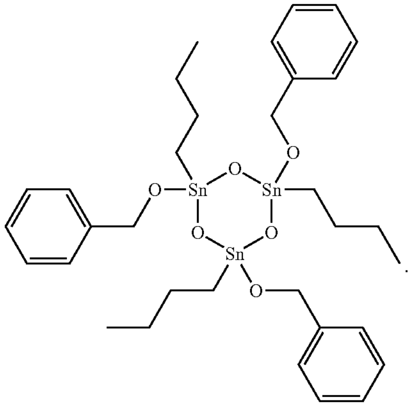

14. The semiconductor photoresist composition of claim 1, wherein the organometallic compound is included in an amount of about 1 weight percent to about 30 weight percent based on 100 weight percent of the semiconductor photoresist composition.

15. A method of forming patterns, comprising:

forming an etching subject layer on a substrate;

coating the semiconductor photoresist composition of claim 1 on the etching subject layer to form a photoresist layer;

patterning the photoresist layer to form a photoresist pattern; and etching the etching subject layer using the photoresist pattern as an etching mask.

16. The method of claim 15, wherein a first baking process, an exposure process, a second baking process, and a developing process are further sequentially performed between the forming of the photoresist layer and the forming of the photoresist pattern, and the first baking process is performed at a temperature of about 80° C. to about 180° C. for about 30 seconds to about 3 minutes.

17. The method of claim 16, wherein the exposure process uses light having a wavelength of about 5 nm to about 150 nm.

18. The method of claim 16, wherein the second baking process is performed at a temperature of about 120° C. to about 200° C. for about 30 seconds to about 3 minutes.

19. The method of claim 16, wherein the developing process is performed by dissolving and removing the photoresist layer corresponding to a non-exposed region using a developer, and the developer is an organic solvent that is a ketone selected from methyl ethyl ketone, acetone, cyclohexanone and 2-heptanone, an alcohol selected from 4-methyl-2-propanol, 1-butanol, isopropanol, 1-propanol, and methanol, an ester selected from propylene glycol monomethyl ether acetate, ethyl acetate, ethyl lactate, n-butyl acetate, and butyrolactone, an aromatic compound selected from benzene, xylene and toluene, or a combination thereof; or is an organic solvent in which an acidic substance or a basic substance is mixed with the organic solvent in an amount of less than or equal to about 9 weight percent.

20. The method of claim 15, wherein the photoresist pattern has a width of about 5 nm to about 100 nm.

* * * * *